United States Patent
Kim

(10) Patent No.: US 7,675,356 B2
(45) Date of Patent: Mar. 9, 2010

(54) DIGITAL CONTROLLED FILTER SYSTEM AND FILTERING METHOD

(75) Inventor: Je-kook Kim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 147 days.

(21) Appl. No.: 11/819,849

(22) Filed: Jun. 29, 2007

(65) Prior Publication Data

US 2008/0012633 A1    Jan. 17, 2008

(30) Foreign Application Priority Data

Jul. 12, 2006    (KR)    ...................... 10-2006-0065470

(51) Int. Cl.
*H03K 5/00* (2006.01)
(52) U.S. Cl. ........................ 327/558; 327/551; 375/350
(58) Field of Classification Search ......... 327/551–558; 375/350
See application file for complete search history.

(56) References Cited

U.S. PATENT DOCUMENTS

| 4,686,483 A | 8/1987 | Isshiki et al. |
| 5,097,235 A | 3/1992 | Reichel |
| 5,150,324 A * | 9/1992 | Takasuka et al. ............ 708/801 |
| 5,734,598 A | 3/1998 | Abbott et al. |
| 2005/0152444 A1 | 7/2005 | Kim |

FOREIGN PATENT DOCUMENTS

| KR | 10-2000-0031173 | 6/2000 |
| KR | 10-2005-0073324 | 7/2005 |

* cited by examiner

*Primary Examiner*—Lincoln Donovan
*Assistant Examiner*—Sibin Chen
(74) *Attorney, Agent, or Firm*—Lee & Morse, P.C.

(57) ABSTRACT

A filter system and filtering method includes a subtractor which receives an analog input signal and a reference voltage as a first input, and an analog feedback signal, supplied through a feedback loop, as a second input, and outputs a difference between the analog input signal and the analog feedback signal, and a low pass filter which outputs a digital signal by comparing the output signal of the subtractor and a reference voltage, then integrates duty cycle of the digital signal and calculates a following error amount, and then converts a low pass filtered signal based on the calculated following error amount to an analog signal in order to provide the analog signal to the analog feedback signal, i.e. the second input of the subtractor.

11 Claims, 3 Drawing Sheets

DIGITAL CONTROLLED FILTER SYSTEM AND FILTERING METHOD

BACKGROUND OF THE INVENTION

1. Field of the Invention

The present invention relates to a filter system. More particularly, the present invention relates to a filter system that can be controlled digitally, i.e., without controlling a resistor or a capacitor.

2. Description of the Related Art

Analog low pass filters (LPFs) and high pass filters (HPFs) may be formed using a capacitor. Thus, a capacitance value and a resistance value may be changed i, so in order to regulate a cut off frequency (fc) of such filters. Accordingly, the analog LPFs and HPFs have disadvantages in terms of varying the fc and integration.

Further, an offset may be generated due to a level integral by the capacitor. Additionally, a large driving capability may be required in order to operate the LPFs or HPFs. Accordingly, the analog LPFs and HPFs may consume a large amount of current. Moreover, it may be difficult to control a passive device, e.g., a resistor or a capacitor forming a filter, to respond to a rapidly changing input signal.

Filters using a variable resistor, a plurality of switched capacitors and/or an externally regulated capacitor have been used to improve the range of fcs available. However, all of the other attendant disadvantages noted above regarding analog filters are still present in these arrangements.

To improve integration of the filter, a capacitor may be regulated through a single pad. To aid in compensating for offset, an output signal may be converted into a digital signal, DC components removed, and then converted back into an analog signal.

However, these filters still may have the following problems.

First, an operational-amplifier offset, generated during a subtraction using a passive device, may occur in an output.

Second, chip integration is too loaded with resistors and capacitors, which are passive devices. Also, the more fcs required, complexity of an array of a switch for selecting a passive device, e.g., a resistor or and a capacitor, increases.

Third, it is difficult to apply various fcs. That is, only limited fcs can be used due to the use of passive devices.

Fourth, an appropriate response to a rapid change in an input signal may not be possible. That is, a capacitor may react even to an abnormal input signal. Accordingly, an error may occur, and an adaptive response to a rapid change in an input signal may not be executed.

Fifth, an external pad, i.e., a pin, has to be used.

SUMMARY OF THE INVENTION

The present invention is therefore directed to providing a filter system and filtering method, which substantially overcomes one or more of the problems due to the limitations and disadvantages of the related art.

It is therefore a feature of an embodiment of the present invention to provide a filter system and filtering method that may be controlled digitally.

It is therefore another feature of an embodiment of the present invention to provide a filter system and filtering method that may reduce or prevent an offset.

It is therefore a feature of an embodiment of the present invention to provide a filter system and filtering method that allow a high degree of integration to be realized.

It is therefore a feature of an embodiment of the present invention to provide a filter system and filtering method that provides for an adaptable cut off frequency.

It is therefore a feature of an embodiment of the present invention to provide a filter system and filtering method that avoids using an external pad.

At least one of the above and other features and advantages of the present invention may be realized by providing a filter system, including a subtractor adapted to receive an analog input signal and a reference voltage at a first input, and an analog feedback signal, supplied through a feedback loop, at a second input, and to output a difference between the analog input signal and the analog feedback signal, and a low pass filter adapted to output a digital signal by comparing the output signal of the subtractor and the reference voltage, to integrate a duty of the digital signal and to calculate a following error amount, and to convert a low pass filtered signal based on the calculated following error amount into the analog feedback signal to be output to the second input of the subtractor.

The subtractor and the low pass filter may form a high pass filter, and the subtractor may output a high pass filtered signal. The subtractor may be adapted to receive the input signal, including an AC component, a DC component, and the reference voltage, at the first input, and a DC signal, which is the analog feedback signal, at the second input, to thereby output a difference signal including the AC component and the reference voltage.

The low pass filter may include a comparison unit adapted to receive the output signal of the subtractor at a first input and the reference voltage at a second input, and to output a digital value, a duty counter adapted to count duties of the output of the comparison unit, a latch unit adapted to latch an output of the duty counter, a control unit adapted to control the duty counter and the latch unit, a following error amount generation unit adapted to generate the following error amount by comparing the latched duty error amount with a target value, a ripple removal and DC gain control unit adapted to remove a ripple component in the following error and controls the DC gain using an integral, and a digital analog conversion unit which converts the calculated error integral to the analog feedback signal. The control unit may be adapted to generate a latch clock signal for latching the output of the duty counter in a certain period and to generate a reset signal for resetting the duty counter.

The ripple removal and DC gain control unit may include an error low pass filter adapted to remove the ripple component and a residual accumulation filter adapted to control the DC gain. The error low pass filter may include a first low pass filter adapted to low pass filter a difference between the duty error, output from the following error amount generation unit, and a target duty, a first adder adapted to add an output of the first low pass filter and a feedback signal, and a first feedback loop adapted to provide the feedback signal to the first adder, wherein the first feedback loop includes a first admittance and a second low pass filter adapted to low pass filter a signal passed through the first admittance.

The residual accumulation integrator may include a second adder for adding the output of the error low pass filter and a feedback signal, and a second feedback loop for providing the feedback signal to the second adder, wherein the second feedback loop includes a third low pass filter, a third adder, a second admittance, and a fourth low pass filter.

At least one of the above and other features and advantages of the present invention may be realized by providing a method including receiving an analog input signal and a reference voltage as one input, and an analog feedback signal through a feedback loop as another input, calculating a difference between the analog input signal and the analog feedback signal, outputting a digital signal by comparing the calculated difference with the reference voltage, integrating a duty cycle of the digital signal and calculating a following error amount, low pass filtering the calculated following error amount, and converting the low pass filtered signal into an analog signal to provide the analog feedback signal.

In calculating the difference, a high pass filtered signal may be output. The analog input signal may include an AC component and a DC component, the analog feedback signal may be a DC signal, and the difference may include the reference voltage and the AC component. The filtering method may further include removing a ripple component in the following error amount, and controlling a DC gain using an integral.

BRIEF DESCRIPTION OF THE DRAWINGS

The above and other features and advantages of the present invention will become more apparent by describing in detail exemplary embodiments thereof with reference to the attached drawings, in which.

DETAILED DESCRIPTION OF THE INVENTION

Figure 1:
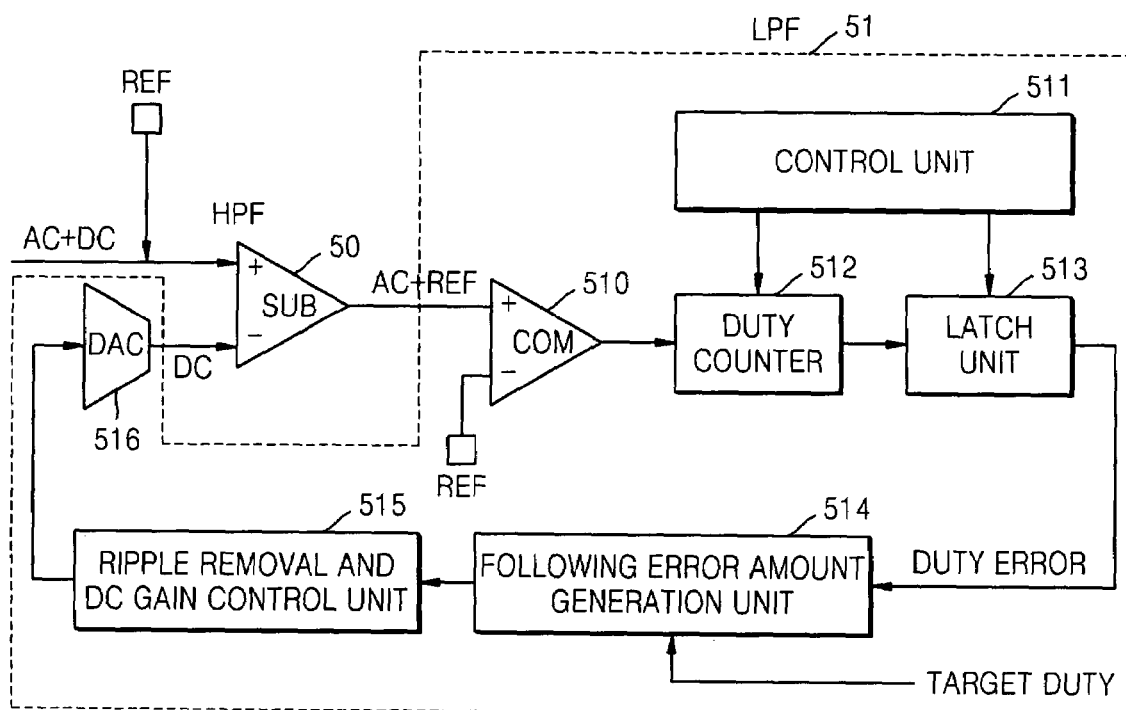
FIG. 1 illustrates a block diagram of a filter system that is controlled digitally according to an embodiment of the present invention.

Korean Patent Application No. 10-2006-0065470, filed on Jul. 12, 2006, in the Korean Intellectual Property Office, and entitled: "Digital Controlled Filter System and Filtering Method," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

A filter system in accordance with embodiments of the present invention may include a subtractor and a low pass filter that may be controlled digitally. That is, unlike a conventional method of level integrating with a capacitor, a resistance, and pads, a low pass filter according to embodiments of the present invention may be realized by a low pass filter that can be controlled digitally by integrating a duty cycle.

By digitizing an analog part, a system on chip (SOC) may be easily realized. Thus, problems caused while preparing the SOC, because the analog part cannot be reduced proportionally to a digital part, may be reduced or prevented. Accordingly, production costs may be reduced and properties of the parts can be distributed uniformly.

Also, a number of pins used may be reduced as external parts are reduced, and a much better response to a rapidly changing input signal may be realized, as it is easy to control properties of the parts. Various cut-off frequencies may be made to correspond to digital filter coefficients, and thus, the setting of a desired cut-off frequency is easy.

Moreover, an offset may be loaded into a filter output by changing a target value, and the filter output may not be affected by an input condition due to digital control. That is, even when there is noise in an input signal, a digitally controlled low pass filter is not affected by the noise like a conventional low pass filter is, due to the formation of the low pass filter by comparing signals and using a binary signal.

FIG. 1 illustrates a block diagram of a filter system that is controlled digitally according to an embodiment of the present invention. Referring to FIG. 1, the filter system may include a low pass filter (LPF) 51 and a subtractor 50.

The subtractor 50 may receive an input signal IN, including an AC component, a DC component, and a reference voltage REF, at a non-inverting '+' input terminal, and may receive a DC signal, which has been low pass filtered through a feedback loop, to an inverting '−' input terminal. The subtractor 50 may subtract the DC signal from the input signal IN, and may output a high pass filtered signal, i.e. a signal including the AC component and the reference voltage REF (the AC component loaded on the reference voltage REF).

The LPF 51 may have a digitally controlled filter structure. That is, unlike a conventional LPF formed of a capacitor, a resistor, and pads and which level integrates, the LPF 51 integrates duty cycle in order to be controlled digitally.

The LPF 51 may compare the high pass filtered signal, i.e., a signal in which the AC component is loaded on the reference voltage REF, with the reference voltage REF, estimate duty and calculate an error, and output the DC signal, by which a DC gain may be controlled, as an analog signal.

Hereinafter, constitutions of the LPF 51 will be described in detail.

The LPF 51 may include a comparison unit 510, a control unit 511, a duty counter 512, a latch unit 513, a following error amount generation unit 514, a ripple removal and DC gain control unit 515, and a digital analog conversion unit (DAC) 516.

The comparison unit 510 may receive the high pass filtered signal 'AC+REF' at a non-inverting '+' input terminal, and the reference voltage REF at an inverting '−' input terminal, and may compare the high pass filtered signal and the reference voltage REF in order to output a binary, i.e., '0' or '1'. The duty counter 512 may count duties of the output of the comparison unit 510. The latch unit 513 may latch the output of the duty counter 512. The control unit 511 may control the duty counter 512 and the latch unit 513. The following error amount generation unit 514 may generate the following error amount by comparing the latched duty error amount with a target value. The ripple removal and DC gain control unit 515 may remove a ripple component in the following error and may control the DC gain using an integral. The DAC 516 may convert the calculated error integral into an analog signal.

The control unit 511 may control the latch unit 513 by generating a latch clock signal for latching the output of the duty counter 512 in a certain period and may generate a reset signal for resetting the duty counter 512. The ripple removal and DC gain control unit 515 may include an error low pass filter for removing a ripple and a residual accumulation filter for controlling the DC gain.

Figure 2:
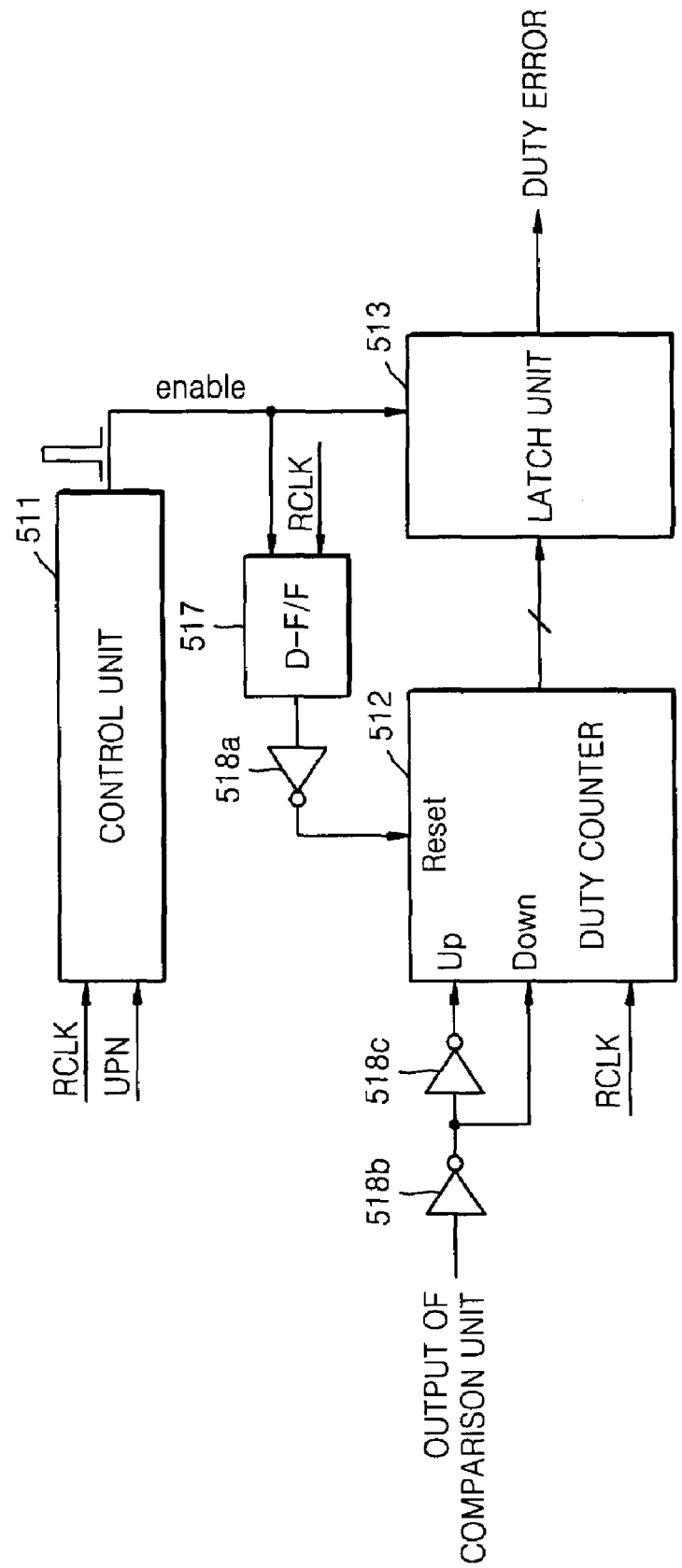
FIG. 2 illustrates a detailed block diagram of a control unit, a duty counter, and a latch unit illustrated in FIG. 1.

FIG. 2 illustrates a detailed block diagram of the control unit 511, the duty counter 512, and the latch unit 513 illustrated in FIG. 1.

The control unit 511 may receive a reference clock RCLK and an update period number UPN, and may output an enable signal. The enable signal may be provided to the latch unit 513 and a D flip-flop (D-F/F) 517. The D-F/F 517 may operate by receiving the enable signal and the reference clock RCLK.

The output of the D-F/F 517 may be output through an inverter 518a and may reset control the duty counter 512.

The output of the comparison unit 510 may pass through two inverters 518b and 518c. The output that has just passed through the inverter 518b may be used in down counting of the duty counter 512, and the output that has passed through both inverters 518b and 518c may be used in up counting of the duty counter 512. The duty counter 512 may operate in response to the reference clock RCLK.

Figure 3:
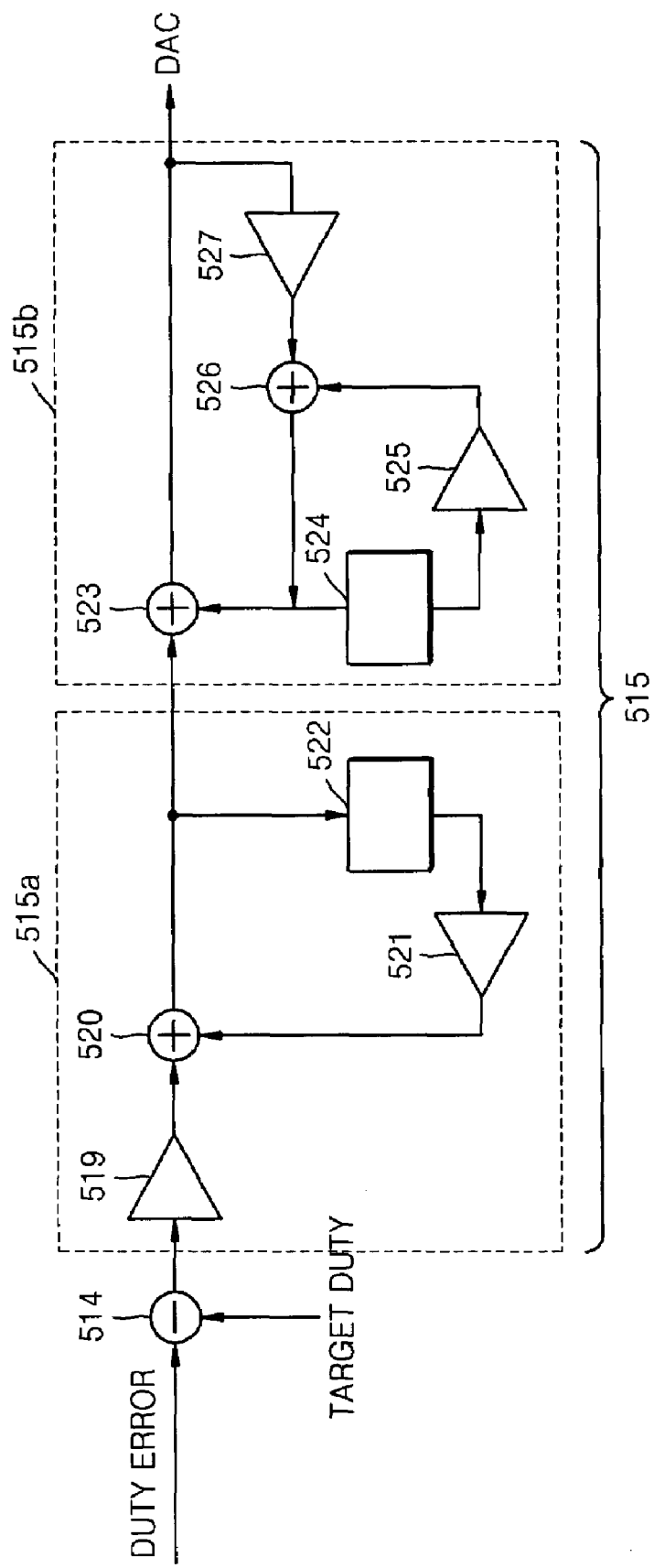
FIG. 3 illustrates a detailed block diagram of a following error amount generation unit and a ripple removal and DC gain control unit illustrated in FIG. 1.

FIG. 3 illustrates a detailed block diagram of the following error amount generation unit 514 and the ripple removal and DC gain control unit 515 illustrated in FIG. 1. Referring to FIG. 3, the ripple removal and DC gain control unit 515 may include an error low pass filter 515a for removing a ripple and a residual accumulation filter 515b.

The error low pass filter 515a may include a low pass filter 519, an adder 520 and a feed back loop for the adder 520. The low pass filter 519 may low pass filter a difference between the duty error, calculated and output from the following error amount generation unit 514, and a target duty. The adder 520 may add the output of the low pass filter 519 and a feedback signal from the feedback loop. The feedback loop may include an admittance 522 and a low pass filter 521 for low pass filtering a signal passed through the admittance 522.

The residual accumulation filter 515b may include an adder 523 and a feedback loop for the adder 523. The adder 523 may add the output of the error low pass filter 515a and a feedback signal from the feedback loop. The feedback loop may include a low pass filter 527, an adder 526, an admittance 524, and a low pass filter 525, wherein the admittance 524 and the low pass filter 524 may form an auxiliary feedback loop. The low pass filter 527 may low pass filter an output form the adder 523. The adder 526 may add the output of the low pass filter 527 and a feedback signal from the auxiliary feedback loop.

Hereinafter, detailed operations of the filter system will be described referring to FIGS. 1 through 3.

An analog signal (the high pass filtered signal) output from the subtractor 50 may be input at the non-inverting '+' input terminal of the comparison unit 510, then compared with the reference voltage REF input at the inverting '−' input terminal of the comparison unit 510, and then output as a binary signal, i.e., '0' or '1'.

Such binary signals may up/down counted by the duty counter 512. At this time, when up counted from the initial '0', '+1' is counted based on the reference clock RCKL and when down counted, '−1' is counted, according to a signed counter method. When the duty counter 512 is in a signed mode, when the duty counter 512 is a 16 bit counter, the maximum value of '+' is "16' h7fff" including a signed bit and the maximum value of '−' is "16' h8000".

An update period signal may be provided by the control unit 511, and the latch unit 513 may latch the update period signal. For example, when a clock is 100 MHz and an update latch signal is generated at each 1 MHz, 50 up countings and 50 down countings may be performed based on the center of the input signal IN.

When the resulting signal of the duty counting is received periodically in order to be subtracted from a target signal, then low pass filtered digitally, and then converted into an analog signal, the input signal IN may be fed-back in order to be high pass filtered as a desired voltage of an output signal. Accordingly, the value of the feedback loop, formed of the low pass filter 51, may change. Thus, only the AC component, i.e., excluding the DC component, may be output as the input signal IN (the output of the subtractor 50).

The error low pass filter 515a may calculate an average of the duty error in order to determine response time. Also, the error low pass filter 515a may be used to remove ripple. The residual accumulation filter 515b may be used to maintain the output value.

A transmission property of the ripple removal and DC gain control unit 515 may be given by Equation 1 below.

$$H(Z)=(C0/(1-C1Z^{-1}))/(1 \cdot C2/(1-(C3Z^{-1}))) \quad (1)$$

where C0, C1, C2 and C3 are coefficients.

Hereinafter, input/output properties of the ripple removal and DC gain control unit 515 used for forming a digital filter will be described using an actual example.

When a gain of the error low pass filter 515a is A, a gain of the residual accumulation filter 515b is B, and the output is Y, then Y=A×duty error amount+B×Y. In other words, Y−BY=A×duty error amount. Rearranging, the equation becomes Y=(A/(1−B))×duty error amount.

When a pole frequency is set at 1,000 Hz, the gain A is '1' (0 dB) until 100 Hz, and the gain B is '1' (0 dB) until 100 Hz, a loop property decreases from an infinite gain to '−20 dB/decade' from 0 to 100 Hz, and decreases to '−40 dB/decade' at 1,000 Hz.

Since in the DC domain up to 100 Hz, the gain B is '1', the output "Y=(1/(1−1)×error" becomes "Y=∞ gain×error". Accordingly, when an actual error value is near '0', the gain value is infinite.

The residual accumulation filter 515b may determine a DC shift response time, and the error low pass filter 515a may determine an AC response time of the actual following frequency.

As described above, a digitally controlled low pass filter may be realized by integrating duty cycles. Such a digitally controlled low pass filter according to an embodiment of the present invention, may provide the following advantages.

First, a circuit structure may be simple, since analog parts may be replaced with digital parts. Also, size and production costs of the circuit may be reduced, and a SOC may be more readily realized.

Second, problems caused by noise, amplifier offset, etc., may be reduced or eliminated because of the digital process.

Third, by replacing analog parts with digital parts, a SOC may be readily prepared, production costs may be reduced, and the quality of the low pass filter may be increased.

Fourth, power consumption may be reduced.

Fifth, since an internal or external capacitor need not be used, the number of pins or external parts may be reduced.

Sixth, regulation of an offset is not needed, since the offset no longer gives rise to a negative effect.

Seventh, a DC voltage may vary when applied to the output of a high pass filter using the digitally controlled low pass filter in order to set a target voltage.

Eighth, by digitally processing an analog low pass filter, a pole frequency of the analog low pass filter may be easily changed and may be accurately realized without any dispersion.

Ninth, by controlling a value of a low pass filter, which is in a feedback loop form used for digitally realizing a high pass filter, response to a rapidly changing input signal may be quick.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A filter system, comprising:
   a subtractor which is adapted to receive an analog input signal and a reference voltage at a first input, and an analog feedback signal, supplied through a feedback loop, at a second input, and to output a difference between the analog input signal and the analog feedback signal; and
   a low pass filter which is adapted to output a digital signal by comparing the output signal of the subtractor and the reference voltage, to integrate a duty of the digital signal and to calculate a following error amount, and to convert a low pass filtered signal based on the calculated following error amount into the analog feedback signal to be output to the second input of the subtractor, the low pass filter including
      a comparison unit adapted to receive the output signal of the subtractor at a first input and the reference voltage at a second input, and to output a digital value,
      a duty counter adapted to count duties of the output of the comparison unit,
      a control unit adapted to control the duty counter,
      a following error amount generation unit adapted to generate the following error amount by comparing the duty error amount with a target value,
      a ripple removal and DC gain control unit adapted to remove a ripple component in the following error and controls the DC gain using an integral, and
      a digital analog conversion unit which converts the calculated error integral to the analog feedback signal.

2. The filter system as claimed in claim 1, wherein the subtractor and the low pass filter form a high pass filter, and the subtractor outputs a high pass filtered signal.

3. The filter system as claimed in claim 1, wherein the subtractor is adapted to receive the input signal, including an AC component, a DC component, and the reference voltage, at the first input, and a DC signal, which is the analog feedback signal, at the second input, to thereby output a difference signal including the AC component and the reference voltage.

4. The filter system as claimed in claim 1, wherein the low pass filter comprises:
   a latch unit adapted to latch an output of the duty counter;
   the control unit adapted to control the latch unit.

5. The filter system as claimed in claim 4, wherein the control unit is adapted to generate a latch clock signal for latching the output of the duty counter in a certain period and to generate a reset signal for resetting the duty counter.

6. The filter system as claimed in claim 4, wherein the ripple removal and DC gain control unit comprises:
   an error low pass filter adapted to remove the ripple component; and
   a residual accumulation filter adapted to control the DC gain.

7. The filter system as claimed in claim 6, wherein the error low pass filter comprises:
   a first low pass filter adapted to low pass filter a difference between the duty error, output from the following error amount generation unit, and a target duty;
   a first adder adapted to add an output of the first low pass filter and a feedback signal; and
   a first feedback loop adapted to provide the feedback signal to the first adder,
   wherein the first feedback loop includes a first admittance and a second low pass filter adapted to low pass filter a signal passed through the first admittance.

8. The filter system as claimed in claim 7, wherein the residual accumulation integrator comprises:
   a second adder for adding the output of the error low pass filter and a feedback signal; and
   a second feedback loop for providing the feedback signal to the second adder,
   wherein the second feedback loop includes a third low pass filter, a third adder, a second admittance, and a fourth low pass filter.

9. A filtering method, comprising:
   receiving an analog input signal and a reference voltage as one input, and an analog feedback signal through a feedback loop as another input;
   calculating a difference between the analog input signal and the analog feedback signal;
   outputting a digital signal by comparing the calculated difference with the reference voltage;
   counting duties of the digital signal and outputting a duty error;
   generating a following error amount by comparing the duty error amount with a target value
   integrating a duty cycle of the digital signal and calculating a following error amount;
   low pass filtering the calculated following error amount; and
   converting the low pass filtered signal into an analog signal to provide the analog feedback signal;
   removing a ripple component in the following error amount; and
   controlling a DC gain using an integral.

10. The filtering method as claimed in claim 9, wherein in the calculating of the difference, a high pass filtered signal is output.

11. The filtering method of as claimed in 9, wherein the analog input signal includes an AC component and a DC component, and the analog feedback signal is a DC signal, and the difference includes the reference voltage and the AC component.

* * * * *